United States Patent [19]

Knutson

[11] Patent Number: 5,446,450

[45] Date of Patent: Aug. 29, 1995

[54] GENUS TOWER LIGHT CONTROLLER

[75] Inventor: Paul Knutson, San Antonio, Tex.

[73] Assignee: Sony Electronics Inc., Park Ridge, N.J.

[21] Appl. No.: 145,700

[22] Filed: Nov. 4, 1993

[51] Int. Cl.$^6$ .............................................. G08B 21/00
[52] U.S. Cl. .................................. 340/635; 340/634
[58] Field of Search ..................... 340/634, 635, 815; 307/601; 331/57; 414/217; 364/478; 118/719; 437/1-7

[56] References Cited

U.S. PATENT DOCUMENTS

| | | | |
|---|---|---|---|
| 4,682,927 | 7/1987 | Southworth et al. | 414/217 |
| 4,828,224 | 5/1989 | Crabb et al. | 414/217 |
| 5,092,728 | 3/1992 | Crabb et al. | 414/217 |
| 5,153,841 | 10/1992 | Goff et al. | 364/478 |
| 5,166,884 | 11/1992 | Maney et al. | 364/478 |
| 5,256,204 | 10/1992 | Wu | 118/719 |

*Primary Examiner*—Brent Swarthout
*Assistant Examiner*—Ashok Mannava
*Attorney, Agent, or Firm*—Ronald P. Kananen

[57] ABSTRACT

A tower light controller comprises logic circuitry that easily connects with equipment used in the production of semiconductor wafers. The tower light controller uses the existing signals in the production equipment, namely a process signal, an alarm signal, left and right cassette present signals, and left and right atmosphere signals, to appropriately drive a light tower comprised of a yellow lamp, a red lamp, and a green lamp. The logic circuitry turns on the green lamp when a product is being run. A yellow lamp is continuously driven when the equipment has wafers that are ready to be unloaded and the yellow lamp is flashed when the equipment is ready to be loaded with wafers. The red lamp is flashed during alarm conditions and is driven continuously when the equipment is placed in a repair or in a preventative maintenance mode. The logic circuitry also comprises an oscillator formed by a series connection of three inverters. A pair of resistors are connected in series with each other and across the first and third inverters. A capacitor has one terminal connected between the second and the third inverters and the other terminal connected between the two resistors. The circuit additionally comprises a pair of LEDs, reverse biased with respect to each other, connected across the second inverter. With the addition of the two LEDs, the frequency of the oscillating signal may be lowered past the typical floor of 4 to 7 Hz down to about 0.25 Hz.

12 Claims, 10 Drawing Sheets

GENUS TOWER LIGHT CONTROLLER

BACKGROUND OF THE INVENTION

1. Field of the Invention

The invention generally relates to an apparatus for indicating the states of a fabrication process and, more particularly, to a tower light controller for controlling a light tower that visually indicates the states of the fabrication process.

2. Description of Prior Art

In production equipment for the fabrication of semiconductor wafers, it is desirable to indicate the various states of the production process. These states include the states of when the wafers are being processed or when the equipment is self-calibrating, when the wafers are ready to be loaded into the equipment, when the wafers are ready to be unloaded from the equipment, when an alarm has been activated, and when the equipment is in a repair or in a preventative maintenance (PM) mode.

Some currently available production equipment has the option to indicate these different states of the production process. With such an option, the equipment turns on a green lamp to indicate that the wafers are being processed. To indicate that the wafers are ready to be loaded, the equipment turns on a yellow lamp and to indicate that the wafers are ready to be unloaded the equipment flashes the yellow lamp. An alarm is indicated with a flashing red lamp and a state when the equipment is in a repair mode or in a PM mode is indicated by a solid red lamp.

Not all production equipment, however, has the ability to provide these indications. Previously manufactured equipment was often produced without the ability to indicate these different production states and currently manufactured equipment is still being produced without this ability. It is therefore desirable to be able to retrofit existing equipment so that the states of the production process can be easily indicated.

Moreover, the production equipment that has the ability to indicate the states of the production process often provides this capability by using programmable logic controllers (PLCs). The PLCs are relatively complex and need to be programmed to correctly drive the lamps to indicate the various production states. It is therefore a problem in the prior art to provide indications of the production process with circuitry that does not require any programming and that uses relatively simple components.

SUMMARY OF THE INVENTION

It is an object of the present invention to provide an apparatus which overcomes these as well as other problems in the prior art.

It is also an object of the present invention to provide an apparatus that provides indications of the various states of the production process.

It is another object of the present invention to provide an apparatus that is comprised of relatively simple circuit components.

It is yet another object of the present invention to provide an apparatus for providing indications of the various states of the production process which can be easily connected to an existing piece of production equipment.

It is a further object of the present invention to provide an apparatus for providing indications of the various states of the production process that uses signals generated by the production equipment.

Additional objects, advantages and novel features of the invention will be set forth in the description which follows, and will become apparent to those skilled in the art upon reading this description or practicing the invention. The objects and advantages of the invention may be realized and attained by the appended claims.

To achieve the foregoing and other objects, in accordance with the present invention, as embodied and broadly described herein, an apparatus for providing indications of the various states of a production process comprises three indicators, which are preferably a yellow lamp, a red lamp, and a green lamp, for indicating the various states of the production process. The apparatus is preferably for use with production equipment that has both a left cassette chamber and a right cassette chamber.

The apparatus comprises incoming logic circuitry that receives left and right cassette present signals and left and right atmosphere signals from the production equipment and generates first and second signals that change their logical values when their respective chamber is empty and ready to be loaded with wafers and when their respective chamber has wafers present that need to be unloaded. Logic circuitry associated with the first indicator receives the first and second signals and continuously drives the first indicator when one of the chambers is ready to be loaded with wafers and intermittently drives the first indicator when one of the chambers has wafers that are ready to be unloaded. The apparatus also has logic circuitry for turning off the first indicator when both chambers are pumped down to a vacuum with wafers present in the chambers.

The second and third indicators also have logic circuitry for driving the second and third indicators. The logic circuitry associated with the second indicator intermittently drives the second indicator when an alarm signal is received from the production equipment and continuously drives the second indicator when the production process is placed in an interrupt mode of operation. The logic circuitry associated with the third indicator drives the third indicator when a process signal is received from the production equipment. The logic circuitry for the first and third indicators is also connected to the logic circuitry for the second indicator so that when an alarm signal is received, the first and third indicators cannot be driven by the logic circuitry for the first and third indicators.

An apparatus of the invention also comprises circuitry for generating an oscillating signal. The circuitry comprises first, second, and third inverters connected in series with each other. A pair of resistors are connected in series with each other and also across the first and third inverters so as to form a circuit loop. A capacitor has one terminal connected between the second and third inverters and the other terminal connected between the two resistors. The circuit additionally comprises a pair of LEDs connected across the second inverter with the two LEDs reverse biased with respect to each other. The two LEDs allow the frequency of the oscillating signal, which is generated at the output of the third inverter, to be lower than that possible without the use of the two LEDs.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings.

DETAILED DESCRIPTION OF THE PREFERRED EMBODIMENT

Reference will now be made in detail to the preferred embodiment of the invention, an example of which is illustrated in the accompanying drawings.

Figure 1:
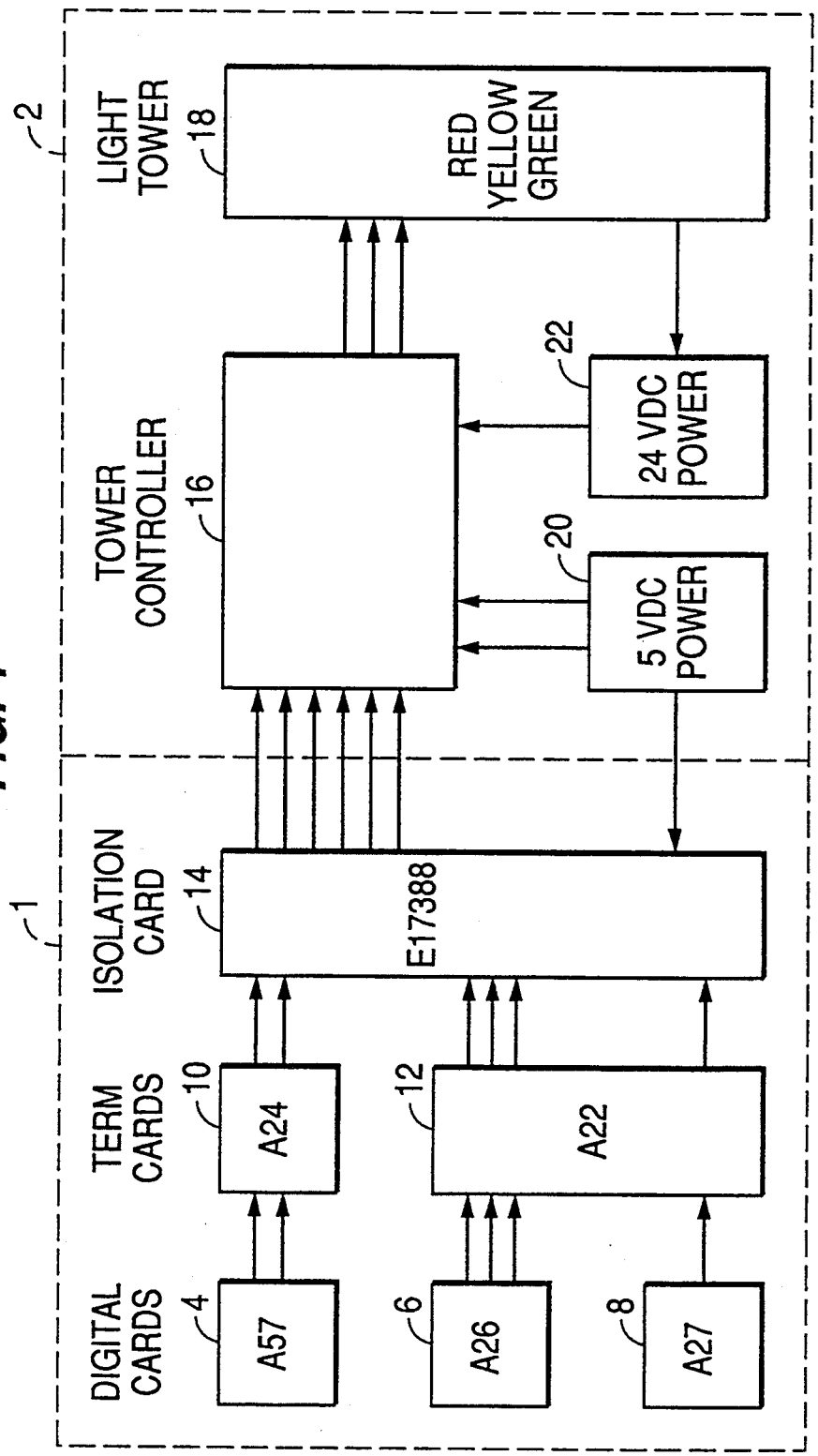
FIG. 1 is a block diagram of an embodiment of the invention with its connection to a piece of production equipment.

With reference to FIG. 1, a piece of a production equipment is generally illustrated with reference numeral 1 while an apparatus of the invention is generally illustrated with reference numeral 2. To serve merely as an example, the production equipment 1 may comprise the Genus 8710. The Genus 8710 is a chemical vapor deposition (CVD) system that is manufactured without the ability to indicate the states of the production process. The Genus 8710 is comprised of a left cassette chamber and a right cassette chamber which can both hold up to 25 wafers per chamber. A loading chamber has a loading apparatus which can retrieve wafers from either the left or right cassette chamber and can then load them into a main reactor. Although the Genus 8710 is a dual cassette chamber system, the invention is also applicable to other types of systems, such as a system that only has a single cassette chamber.

The portion of the Genus 8710 illustrated in FIG. 1 is comprised of an A57 digital card 4 for generating a digital process signal and a digital alarm signal, an A26 digital card 6 for generating a digital left atmosphere signal, a digital right atmosphere signal, and a digital left cassette present signal, and an A27 digital card for generating a digital right cassette present signal.

The process signal is at a logical value of "1" when a product is being run. The alarm signal switches to a logical value of "1" when an alarm condition has been activated. The left and right atmosphere signals are at a logical value of "0" when their respective chamber is pumped down to a vacuum and are at a logical value of "1" when the pressure in their respective chamber is at atmospheric pressure or greater. The left and right cassette present signals are at a logical value of "0" when no cassettes are present in their respective chamber and are at a logical value of "1" when the cassettes are present in their respective chamber.

A termination card 10 receives the process and alarm signals and transmits these signals to an opto-isolation card 14. A termination card 12 receives the left and right cassette present signals and the left and right atmosphere signals and transmits these signals to the opto-isolation card 14. The opto-isolation card 14 is used as an interface between the termination cards in the Genus 8710 and a tower controller 16 and prevents the termination cards 10 and 12 from loading the tower controller 16. The opto-isolation card 14 is a negative isolation board and, as a result, the input signals supplied to the opto-isolation card 14 become inverted at the output of the opto-isolation card 14.

The opto-isolation card 14 transmits an inverted process signal, an inverted alarm signal, inverted left and right atmosphere signals, and inverted left and right cassette present signals to the tower controller 16. The tower controller 16 additionally comprises a 5 volt DC power supply 20 and a 24 volt DC power supply 22. The tower controller 16 is connected to a light tower 18 that preferably comprises a yellow lamp, a red lamp, and a green lamp, which are turned on and off according to signals provided from the tower controller 16. Since the Genus 8710 has a built-in opto-isolation card 14, an opto-isolation interface is not required in the apparatus 2. Nevertheless, for other types of production equipment, it may be desirable to incorporate an opto-isolation interface 14 within the apparatus 2 to ensure adequate buffering between the apparatus 2 and the production equipment 1.

Figure 2:
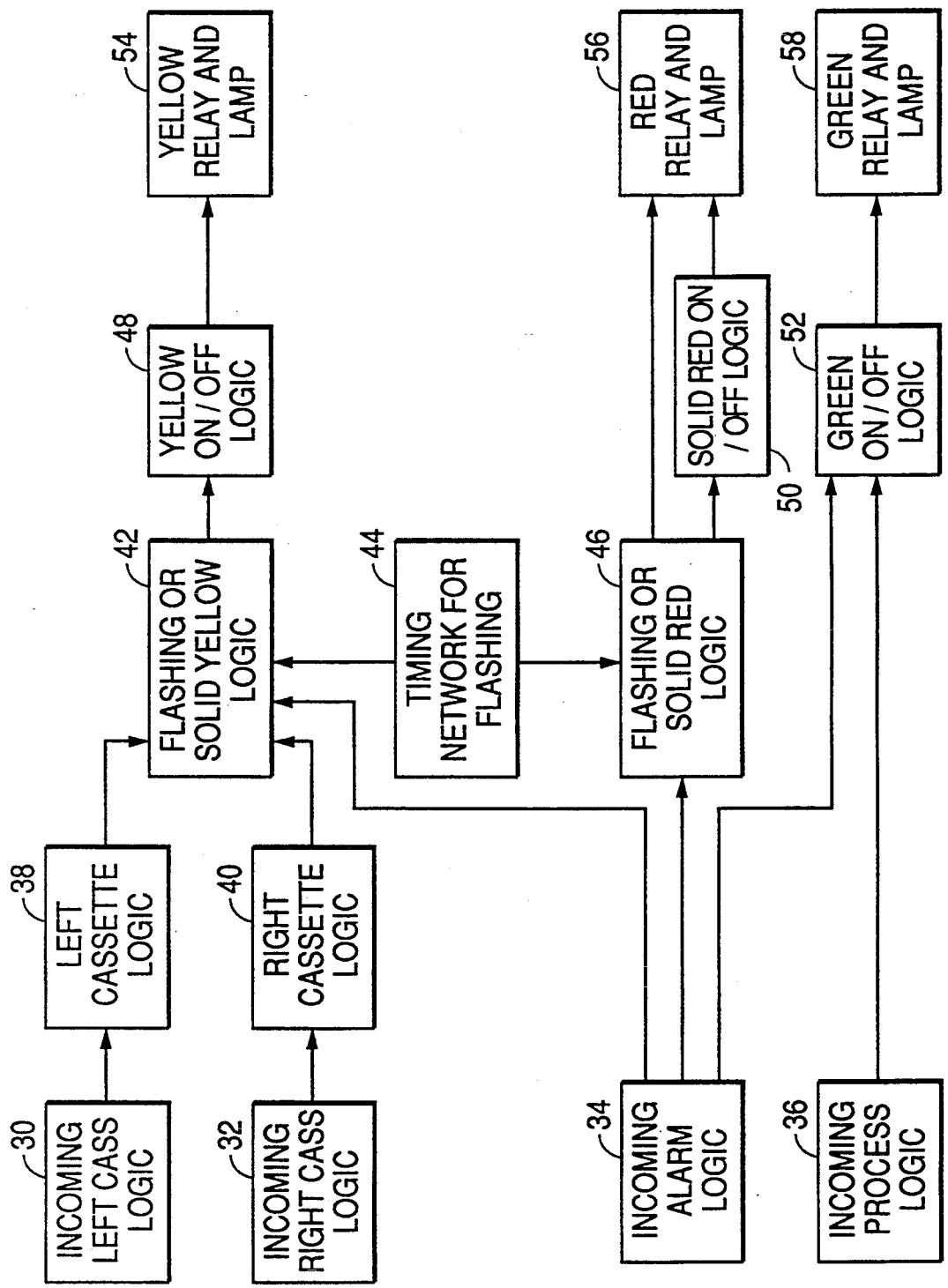
FIG. 2 is a block diagram of a tower controller of the invention.
Figure 3:
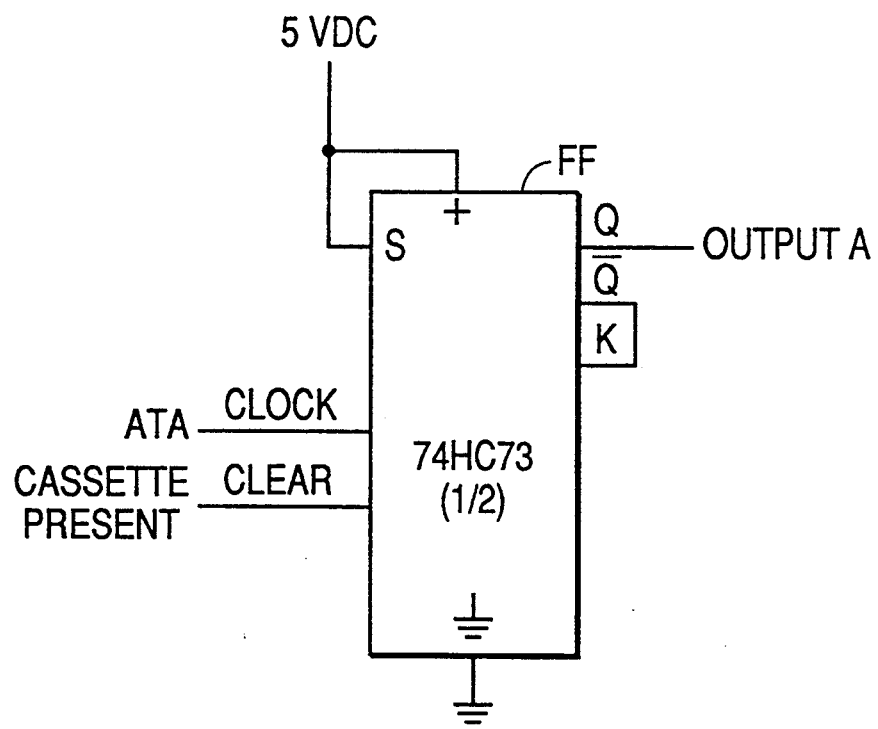
FIG. 3 is an embodiment of a cassette logic circuitry shown in the block diagram of FIG. 2.

As shown in FIG. 2, a block diagram of the tower controller 16 comprises left cassette logic 38 and right cassette logic 40. As shown in FIG. 3, the cassette logic circuits 38 and 40 preferably comprise a JK flip-flop FF that receives the atmosphere signal at its clock input and the cassette present signal at its clear input. The J input is held high to +5 volts, the K input is connected to the $\overline{Q}$ output through a resistor, and the $\overline{Q}$ output is connected to ground through a capacitor. The RC circuit delays the $\overline{Q}$ output before it is supplied to the K input.

When cassettes are loaded into a chamber, the cassette present signal for that chamber goes to a logical value of "1" and the Q output is reset to a logical value of "0." Next, during a typical production process, the process is initiated and the chamber is pumped down to a vacuum. When the chamber is in a vacuum, the atmosphere signal goes to a logical value of "0," which after passing through an inverter, is applied to the clock input of the JK flip-flop FF. Since the JK flip-flop is a negative edge triggered logic circuit, the Q output will not go high until the atmosphere signal rises up to a logical value of "1," which occurs when the chamber is ventilated. Thus, the Q output of the JK flip-flop will switch to a logical value of "1" after the cassettes have been processed and the chamber has been ventilated.

Figure 4:
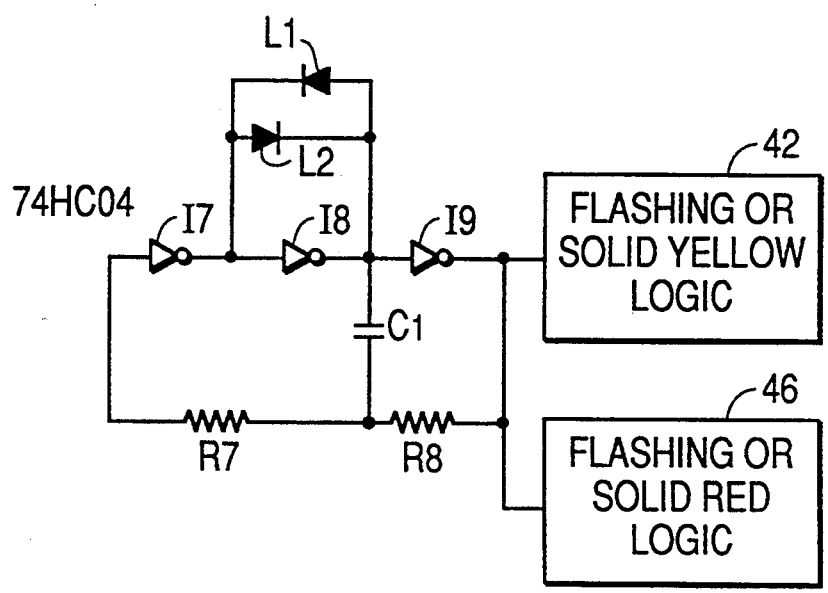
FIG. 4 is an embodiment of the timing network shown in the block diagram of FIG. 2.

With reference to FIG. 4, an embodiment of the timing network for flashing 44 preferably comprises three inverters I7, I8 and I9 connected in series with each other and also in series with a resistor R9 and a resistor R10. A capacitor C1 has one terminal connected between the second inverter I8 and the third inverter I9 and the other terminal connected between the two resistors R9 and R10. This part of the circuit works in a well known manner to generate an oscillating signal whose frequency is determined by the RC circuit consisting of the resistors R9 and R10 and the capacitor C1. For the ease of adjusting the-.frequency of the oscillating signal, resistor R10 preferably comprises a potentiometer. As shown in FIG. 4, the oscillating signal is supplied to the flashing or solid red logic circuitry 46 and the flashing or solid yellow logic circuitry 42 to be used in the flashing of the yellow and red lamps.

The oscillating circuit additionally comprises a pair of LEDs L1 and L2 connected across the second inverter I8. The first LED L1 is connected with its anode between the second inverter I8 and third inverter I9 and its cathode between the first inverter I7 and second inverter I8 and the second LED L2 is reverse biased with respect to the first LED L1 across the same two terminals. Without the two LEDs L1 and L2, the frequency of the circuit may be lowered to about 4 to 7 Hz and any attempt to further lower the frequency will force the circuit to lock up. With the LEDs L1 and L2, On the other hand, the circuit is capable of lowering the frequency even further without locking up. For instance, the frequency of the oscillating signal may be reduced down to about 0.25 Hz without forcing the circuit to lock up.

Figure 5:
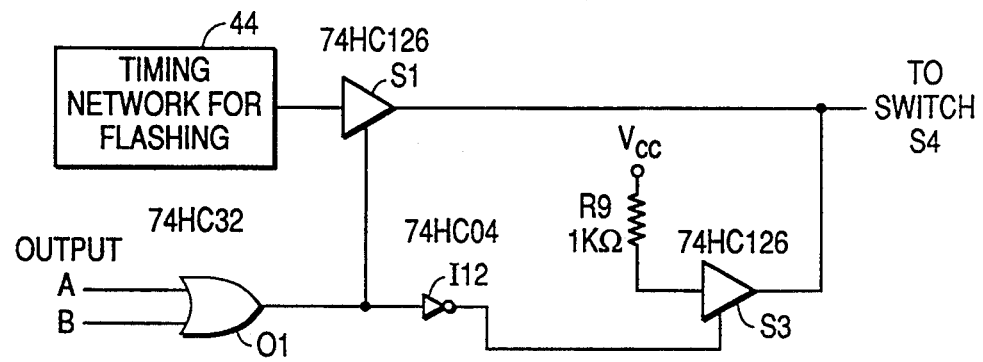
FIG. 5 is an embodiment of the flashing or solid yellow logic circuitry shown in the block diagram of FIG. 2.

An embodiment of the flashing or solid yellow lamp logic circuitry 42, shown in FIG. 5, comprises an OR gate O1 for receiving the Q output from the JK flip-flop for the left chamber and the Q output from the JK flip-flop for the right chamber. When either of the Q outputs for the JK flip-flops goes to a logical value of "1," the OR gate's O1 output also goes to a logical value of "1" and is supplied to a control gate on a switch S1 for enabling the oscillating signal from the timing and flashing network 44 to pass through to a switch S4.

The output of the OR gate O1 is also supplied to an inverter I12 and then to a control gate of a switch S3. Switch S3 has its input connected to a voltage source $V_{cc}$ through a resistor R11 and has its output connected to switch S4. Thus, when a voltage is supplied to the control gate of switch S3, the output of switch S3 is held high due to the presence of voltage $V_{cc}$ at the input of switch S3.

In operation, when a Q output from either JK flip-flop goes to a logical value of "1," the OR gate O1 outputs a high signal which allows the oscillating signal to pass through to switch S4. The high signal from the output of the OR gate O1 is inverted with inverter I12 and disables switch S3. On the other hand, when both of the Q outputs from the JK flip-flops are low, switch S1 is prevented from passing the oscillating signal through to switch S4 but switch S3 is enabled so that a-high signal is passed on to switch S4.

Figure 6:
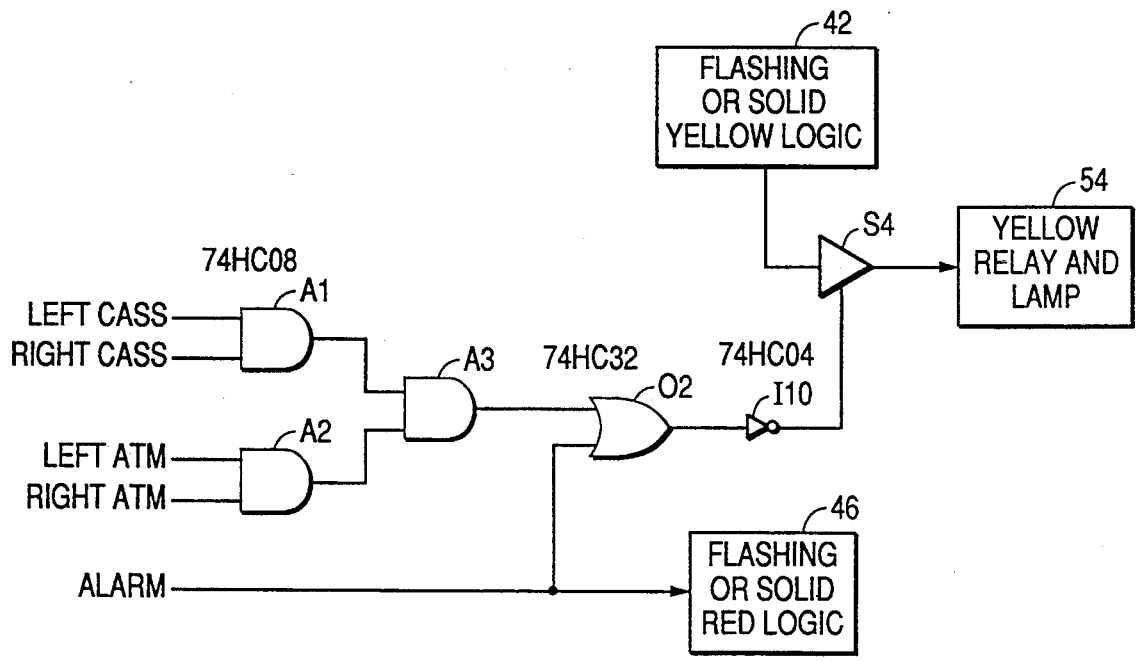
FIG. 6 is an embodiment of the yellow on/off logic circuitry shown in the block diagram of FIG. 2.

An embodiment of the yellow on/off logic circuitry 48 is shown in FIG. 6. This circuit comprises a first AND gate A1 that receives at its two inputs a left cassette present signal and a right cassette present signal. A second AND gate A2 receives at its two inputs the left and right atmosphere signals and a third AND gate A3 receives at its two inputs the outputs from the first and the second AND gates A1 and A2. Therefore, the output of the third AND gate A3 will be at a logical value of "1" only when wafers are in both the left and right chambers and when the left and right chambers are both pumped down to a vacuum.

The output of the third AND gate A3 and the alarm signal are supplied to the two inputs of an OR gate O2, which has its output inverted with inverter I10 before being supplied to the control gate of a switch S4. The output of switch S4 is a yellow control signal for the yellow lamp and is inputted to the yellow relay and lamp circuit 54.

In operation, the yellow lamp will be turned off when an alarm signal is received or when both the left and the right chambers are pumped down to a vacuum and both the chambers have wafers present. In the absence of an alarm signal and if either chamber is not pumped down to a vacuum or does not have any wafers present, then the driving of the yellow lamp will be controlled by the flashing or solid yellow logic circuitry 42.

Figure 7:
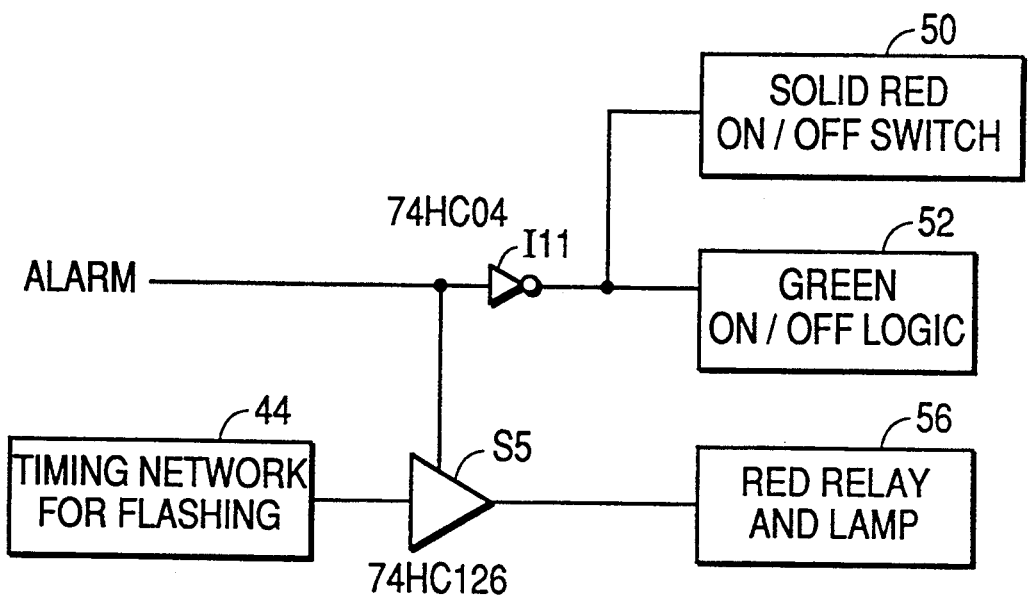
FIG. 7 is an embodiment of the flashing or solid red logic circuitry shown in the block diagram of FIG. 2.

An embodiment of the flashing or solid red logic circuitry 46, shown in FIG. 7, comprises a switch S5 that receives the alarm signal at its control gate, the oscillating signal from the timing network 44 at its input terminal, and has its output connected to the red relay and lamp circuit 56. Thus, when an alarm signal is generated, the switch S5 is activated to pass the oscillating signal from the timing network 44 to the red relay and lamp circuit 56 to cause the red lamp to flash. The alarm signal is also inverted with inverter I11 and then supplied to the solid red on/off switch 50 and also to the green on/off logic circuitry 52.

Figure 8:
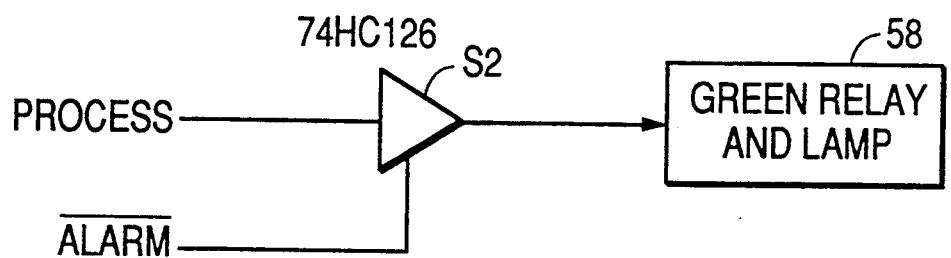
FIG. 8 is an embodiment of the green logic circuitry shown in the block diagram of FIG. 2.

With reference to FIG. 8, an example of the green on/off logic circuitry 52 comprises a switch S2 for receiving the inverted alarm signal at its control gate, the process signal at its input, and has its output connected to the green relay and lamp circuit 58. Consequently, unless an alarm signal is generated, the switch S2 will pass the process signal to the green relay and lamp circuit 58 to light the green lamp. When an alarm is generated, the inverted alarm signal will block the passage of the process signal to the green relay and lamp circuit 58, thereby turning off the green lamp.

Figure 9:
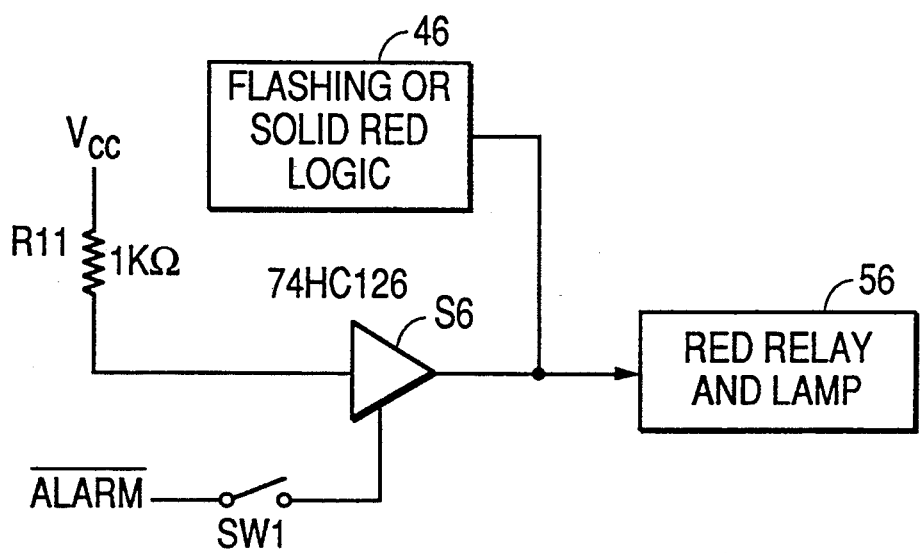
FIG. 9 is an embodiment of the solid red on/off switch shown in the block diagram of FIG. 2.

An example of the solid red on/off switch 50, shown in FIG. 9, comprises a switch SW1 connected between the inverted alarm signal and the control gate of a switch S6. The switch S6 has a voltage $V_{cc}$ supplied to its input terminal through a resistor R12 and has its output connected to the red relay and lamp circuit 56. The switch SW1 is intended to be manually closed when the production equipment is in a repair mode or in a preventative maintenance mode, both of which are times when the inverted alarm signal will be at a logical value of "1." Thus, with switch SW1 closed, a voltage will be applied to the control gate of switch S6 which, in turn, will cause the switch S6 to output a high signal. The high signal from the switch S6 is used by the red relay and lamp circuit 56 for continuously driving the red lamp.

Figure 10:
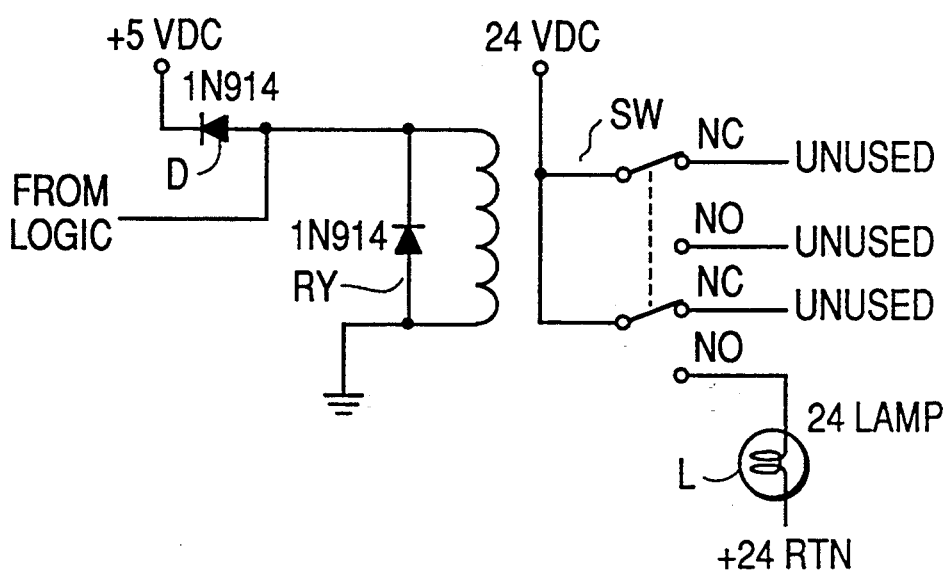
FIG. 10 is an embodiment of the relay and lamp circuitry shown in the block diagram of FIG. 2.

As shown in FIG. 10, an example of a relay and lamp logic circuit comprises a relay RY and a diode D connected in series between +5 volts DC and ground. A control signal from the logic circuitry is supplied to the junction between the relay RY and the diode D. When the control signal is at a logical value of "1," current passes through the relay RY which throws the switch SW from the normally closed contacts NC to the normally open contacts NO. As a result, 24 volts of DC power connected to the stationary contacts of the switch SW is connected across the lamp L and the lamp L is turned on. When the control signal is the oscillating signal, the current through the relay RY oscillates thereby causing the lamp to flash on and off.

Figure 11A:
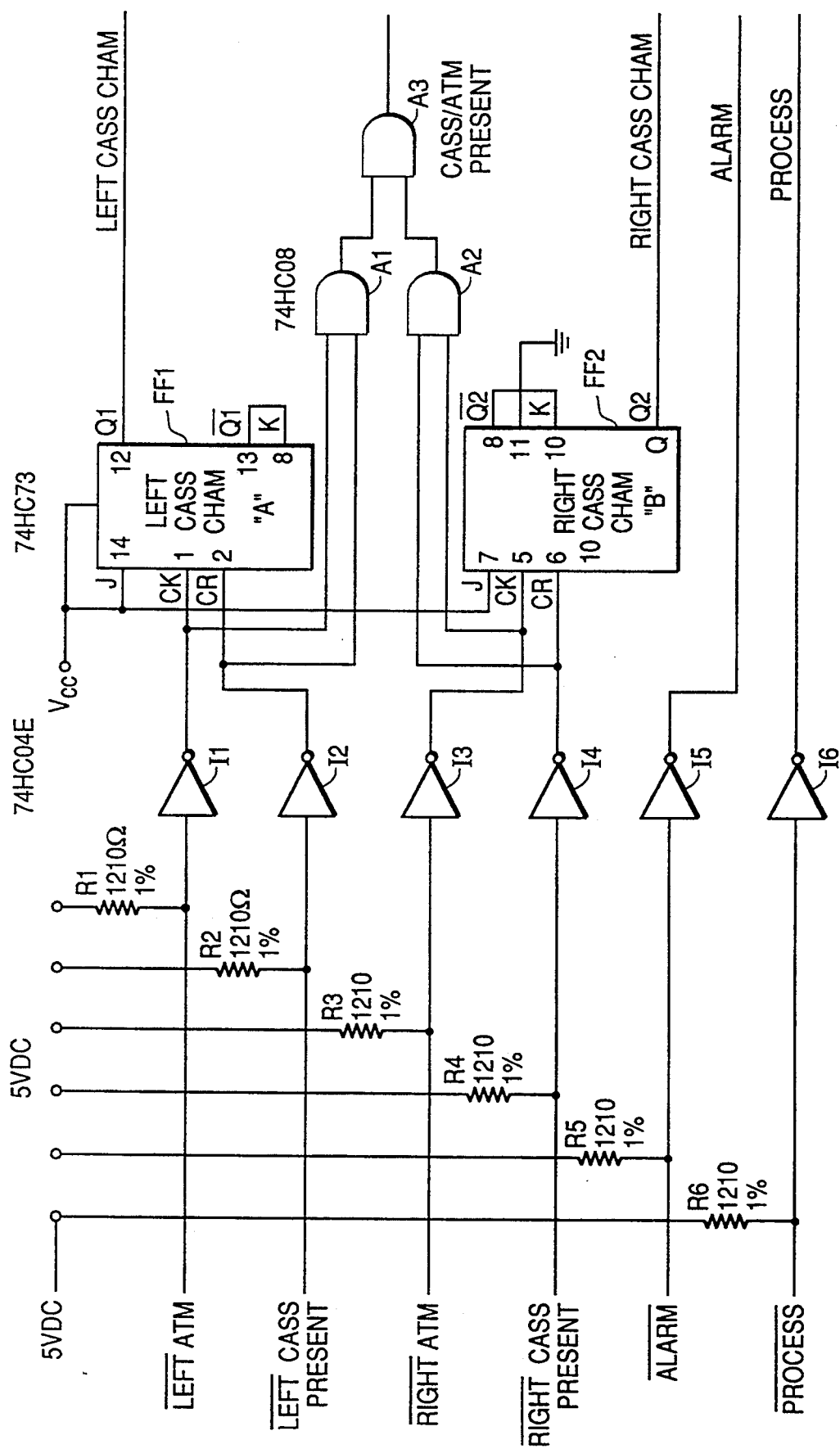
FIGS. 11(A), 11(B), and 11(C) are an embodiment of the circuitry for the tower controller and the light tower of FIG. 1.
Figure 11B:
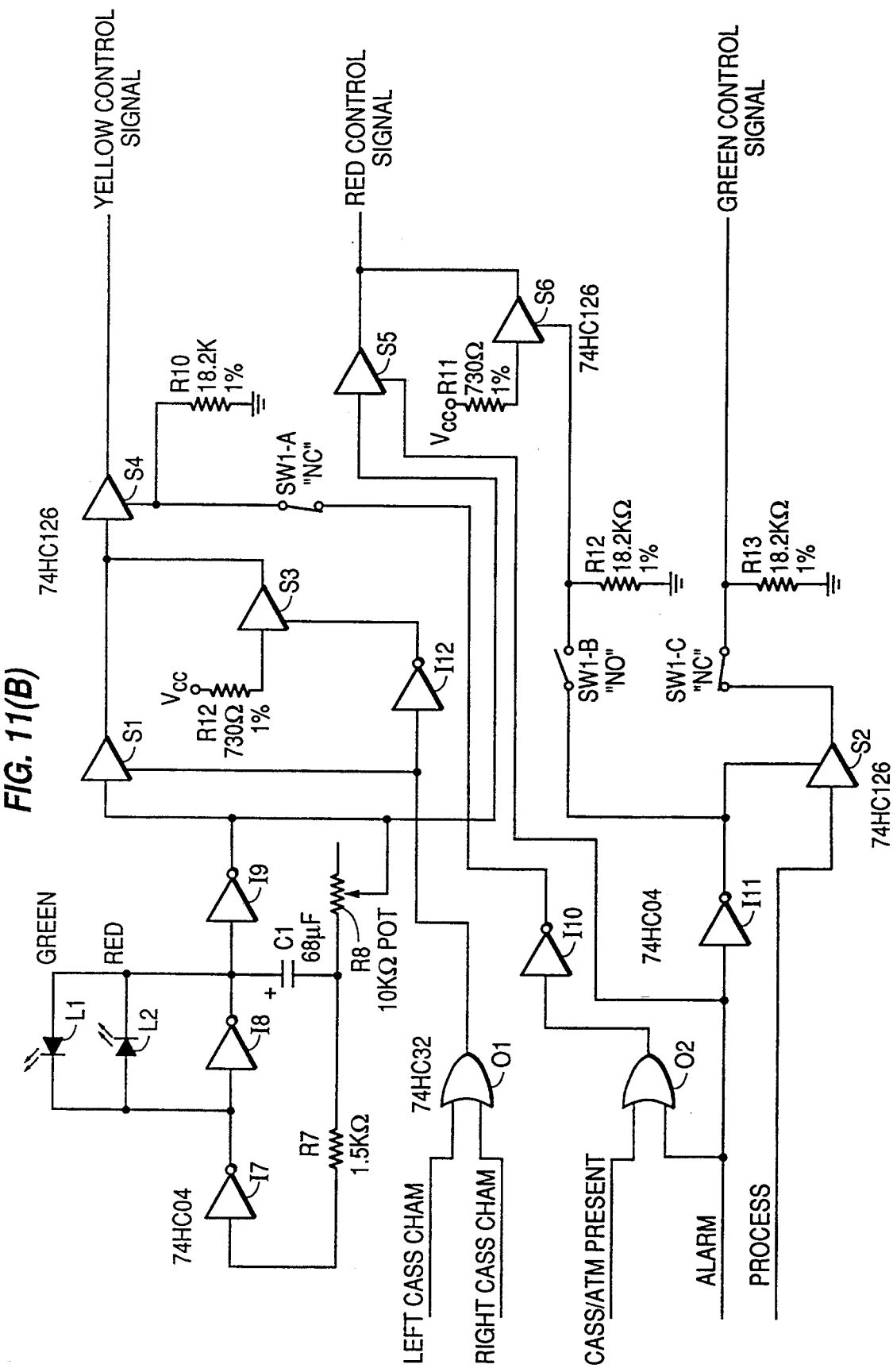
Figure 11C:
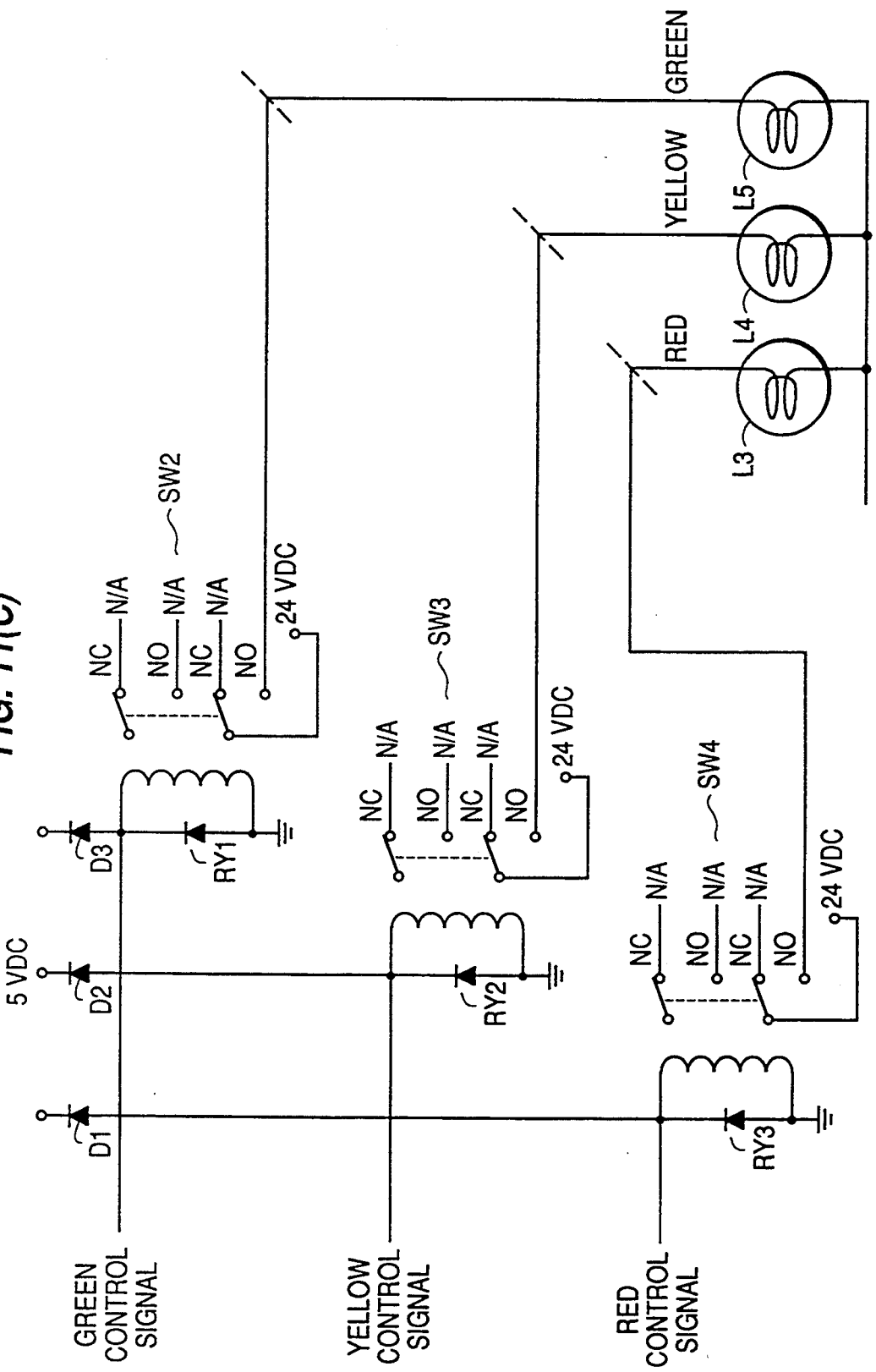

An embodiment of the entire circuitry for the tower controller 16 and the light tower 18 is shown in FIGS. 11(A) to 11(C). Because the opto-isolation card 14 is a negative triggered circuit, the signals received at the inputs to the opto-isolation card 14 become inverted when they are outputted from the opto-isolation card 14. With reference to FIG. 11(A), the incoming logic circuitry for each of the signals consequently comprises a resistor connected between each input line and 5 volts in order to pull the line up to a logical value of "1" and an inverter to reconvert the input signals back to their original form.

For instance, the incoming process logic 36 comprises a resistor R6 connected between 5 volts and the inverted process line to pull the line up to a logical value of "1." An inverter I6 receives the inverted process signal and outputs the original process signal. The incoming logic for the other signals, namely the left and right atmosphere signals, the left and right cassette present signals, and the alarm signal, similarly have resistors R1 to R5 and inverters I1 to I5 which operate to output the original forms of these signals. After passing through inverters I1 and I3, the left and right atmosphere signals are again pulled up to a logical value of "1" and are then respectively passed through inverters I13 and I14.

A first flip-flop FF1, designated for the left cassette chamber, receives the left atmosphere signal from inverter I13 at its clock input CK and the left cassette present signal at its clear input CR. A second flip-flop FF2 is designated for the right cassette chamber and it receives the right, atmosphere signal from inverter I14 at its clock input CK and the right cassette present signal at its clear input CR. For both flip-flops FF1 and FF2, the J inputs are held high, the K inputs are connected to the $\overline{Q}$ output through a resistor, and the $\overline{Q}$ output is grounded through a capacitor. The RC circuits R16-C2 and R17-C3 delay the $\overline{Q}$ outputs of their respective flip-flops FF1 or FF2 before being input into the K inputs. The Q outputs of the JK flip-flops FF1 and FF2 are then supplied to the inputs of OR gate O1 for turning the yellow lamp L4 on or for flashing the yellow lamp L4 on and off.

The left and right cassette present signals and the left and right atmosphere signals are also supplied to AND gates A1 and A2. The AND gate A3 receives the outputs of AND gates A1 and A2 and supplies its output to OR gate O2. As previously discussed above with reference to FIG. 6, the output of AND gate A3 will be at a logical value of "1" when both chambers have cassettes present and both are pumped down to a vacuum. The output of the OR gate O2 is sent through an inverter I10 to the switch S4 for turning off the yellow lamp L4.

As shown in FIGS. 11(A) to 11(C), when an alarm is present, the alarm signal is supplied through OR gate O2, inverter I10 to switch S4 for turning off the yellow lamp L4 and is supplied through an inverter I11 to switch S2 for turning off the green lamp L5. Additionally, switch S5, which has the oscillating signal at its input, receives the alarm signal at the control gate and will therefore pass the oscillating signal through to relay RY3 when an alarm signal is present.

The red lamp is continuously driven when the equipment is placed in a preventative maintenance mode or in a repair mode. To place the equipment in this mode, a switch SW1, which is comprised of a single throw-triple pole switch SW1-A, SW1-B, and SW1-C, is manually opened. As shown in the figures, switch SW1-A is normally closed, switch SW1-B is normally opened, and switch SW1-C is normally closed. By flipping the switch SW1, both the yellow lamp L4 and the green lamp L5 are respectively turned off through the action of switches S4 and S2 while the red lamp L3 is driven continuously through the action of switch S6.

The process signal is typically passed through a switch S2 and is supplied directly to the relay RY1 for the green lamp L5. The process signal, however, is not applied to the green relay RY1 through the action of switch S2 when an alarm is activated causing the alarm signal to go to a logical value of "1."

Figure 12:
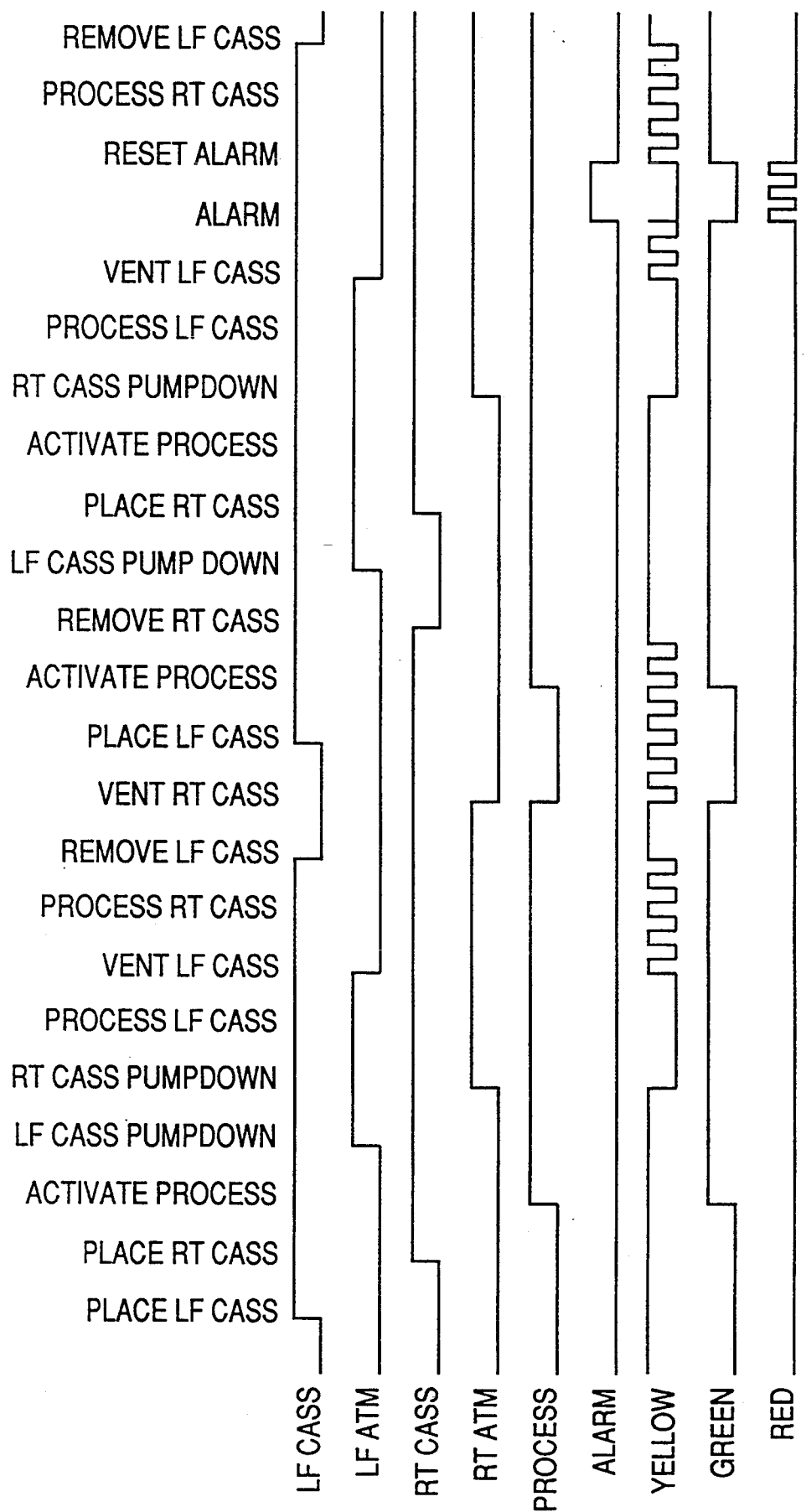
FIG. 12 is a timing chart illustrating the operations of the circuitry of FIG. 11.

A timing chart for the various signals involved with the circuitry of FIGS. 11(A) to 11(C) is depicted in FIG. 12. The timing chart in FIG. 12 is only an example of a possible processing routine and other routines are possible. For instance, although the process initiates with the left chamber, the process could instead begin with the right chamber.

At the initiation of a production routine, since both the left and the right chambers are empty, the Q outputs of both JK flip-flops FF1 and FF2 are low and the yellow lamp is driven continuously to indicate that the wafers are ready to be loaded. The wafers are first placed into the left chamber causing the left cassette present signal to go high. Next, the cassettes are placed into the right chamber causing the right cassette present signal to go high. The left and right cassette present signals are respectively supplied to the clear inputs CR of JK flip-flops FF1 and FF2.

After both chambers have been loaded with wafers, the process is activated. As a result, the process signal goes high and the green lamp L5 is turned on. Next, the left chamber is pumped down to a vacuum and is followed by the pump down of the right chamber. Once both chambers have been pumped down to a vacuum, all of the inputs to AND gates A1, A2, and A3 are at a logical value of "1" since both the left and the right atmosphere signals have gone high. Thus, according to the yellow on/off logic 48, the yellow lamp L4 is extinguished.

The next step in the process is the processing of the wafers in the left chamber and then the ventilation of the left chamber which drops the left atmosphere signal back down to a logical value of "0." The negative transition of the left atmosphere signal triggers the JK flip-flop FF1 thereby setting the Q output at a logical value of "1." The flashing or solid yellow logic circuit 42 reacts to this high level output by passing the oscillating signal to the yellow on/off logic and to the yellow relay and lamp 54 for flashing the yellow lamp L4.

While the right wafers are being processed, the wafers in the left cassette are removed. The removal of the wafers drops the left cassette present signal back down to a logical value of "0" which resets the Q output of JK flip-flop FF1 to a logical value of "0." At this time, both JK flip-flops have low Q outputs and yellow lamp L4 is continuously driven to indicate that the equipment is ready to be loaded with wafers.

After the wafers are removed from the left chamber and the processing in the right chamber halts, the right chamber is ventilated, and both the processing signal and the right atmosphere signal drop down to a logical value of "0." The negative transition of the right atmosphere signal clocks the JK flip-flop FF2 causing the Q output to go high. This high signal is sent to the flashing or solid yellow logic circuit 42 and an oscillating signal is consequently supplied to the yellow on/off logic circuit 48 and to the yellow relay and lamp circuit 54 to flash the yellow lamp L4.

The process continues with the placement of new wafers in the left chamber and the processing of the wafers in the left chamber, which turns the green lamp L5 back on. During normal processing, the above-described routine is repeated. In the event of an alarm, however, the alarm signal goes to a logical value of "1" and the red lamp L3 begins to flash while both the yellow L4 and green L5 lamps are extinguished. At the conclusion of the alarm period, which may be, for example, caused by software after the operator touches a touch sensitive screen, the equipment will resume processing at the point from where the alarm was initiated.

The foregoing description of a preferred embodiment of the invention has been presented for purposes of illustration and description only. It is not intended to be exhaustive or to limit the invention to the precise form disclosed. Many modifications and variations are possible in light of the above teaching.

For example, the double pole double throw switches SW2 to SW4 were employed with relays RY1 to RY3 in order to easily accommodate any updates made on the circuit. For instance, the currently unused contacts on the switches SW2 to SW4 could be used to additionally provide audible signals, such as beeps at different octaves or solid tones at different octaves to represent the various states of the process. These audible tones may be used in conjunction with the lamps L3 to L5 or they may replace the lamps L3 to L5. The double pole double throw switches SW2 to SW4, however, may also be replaced with single pole double throw switches.

The embodiment was chosen and described in order to best explain the principles of the invention and its practical application to thereby enable others skilled in the art to best utilize the invention and various embodiments and with various modifications as are suited to the particular use contemplated. It is intended that the scope of the invention only be limited by the claims appended hereto.

I claim:

1. An apparatus for indicating the states of a semiconductor wafer production process, comprising:
    cassette logic circuitry for generating a first signal that varies depending upon whether wafers are present in a chamber or if said chamber is empty and depending upon whether said chamber is at atmospheric pressure or if said chamber is pumped down to a vacuum;
    first indicator logic circuitry, connected to said cassette logic circuitry, for receiving said first signal, for continuously driving a first indicator when said chamber is ready to be loaded with wafers, and for intermittently driving said first indicator when said first signal indicates that said chamber has wafers that are ready to be unloaded;
    second indicator logic circuitry for intermittently driving a second indicator when an alarm signal is received and for continuously driving said second indicator when said production process is placed in an interrupt mode; and
    third indicator logic circuitry for continuously driving a third indicator when wafers in said chamber are being processed;
    wherein said second indicator logic circuitry is connected to said first indicator logic circuitry and to said third indicator logic circuitry and prevents said first indicator logic circuitry and said third indicator logic circuitry from respectively driving said first and third indicators whenever said alarm signal is received at said second indicator logic circuitry.

2. An apparatus as set forth in claim 1, wherein:
    said cassette logic circuitry is also for generating a second signal that varies depending upon whether wafers are present in a second chamber or if said second chamber is empty and depending upon whether said second chamber is at atmospheric pressure or if said second chamber is pumped down to a vacuum; and
    said first indicator logic circuitry is also for receiving said second signal and for continuously driving said first indicator when said second chamber is ready to be loaded with wafers, and for intermittently driving said first indicator when said first signal indicates that said second chamber has wafers that are ready to be unloaded.

3. An apparatus as set forth in claim 2, wherein said cassette logic circuitry comprises:
    a first JK flip-flop for receiving a first atmosphere signal at its clock input and a first cassette present signal at its clear input and for outputting said first signal at its Q output; and
    a second JK flip-flop for receiving a second atmosphere signal at its clock input and a second cassette present signal at its clear input and for outputting said second signal at its Q output.

4. An apparatus as set forth in claim 3, wherein said first indicator logic circuitry comprises:
    an OR gate having said first signal and said second signal as inputs; and
    means for transmitting an oscillating signal to said first indicator for flashing said first indicator when an output of said OR gate is at a logical value of "1" and for transmitting a constant voltage signal for continuously driving said first indicator when said output of said OR gate is at a logical value of "0."

5. An apparatus as set forth in claim 2, wherein said first indicator logic circuitry comprises:
    a first AND gate having a first cassette present signal and a first atmosphere signal as inputs;
    a second AND gate having a second cassette present signal and a second atmosphere signal as inputs;
    a third AND gate having outputs from said first AND gate and second AND gate as inputs; and
    means for receiving an output of said third AND gate and for turning off said third indicator when said output of said third AND gate is at a logical value of "1."

6. An apparatus as set forth in claim 2, wherein said second indicator logic circuitry comprises:
    a first switch for transmitting an oscillating signal to said second indicator for flashing said second indicator when said alarm signal is at a logical value of "1"; and
    a second switch for transmitting a constant voltage signal to said second indicator for continuously driving said second indicator when said second switch is closed during said interrupt mode.

7. An apparatus as set forth in claim 1, wherein said first indicator is a yellow lamp, said second indicator is a red lamp, and said third indicator is a green lamp.

8. An apparatus as set forth in claim 1, wherein said third indicator logic circuitry comprises a switch for receiving a process signal at an input and an inverted alarm signal at a control gate and for passing said process signal through to a relay and to said third indicator whenever said inverted alarm signal is not received at said control gate.

9. An apparatus as set forth in claim 1, further comprising means for generating an oscillating signal that is used by said first indicator logic circuitry for intermittently driving said first indicator and by second logic indicator circuitry for intermittently driving said second indicator.

10. An apparatus for indicating the states of a semiconductor wafer production process, comprising:
   cassette logic circuitry for generating a first signal that varies depending upon whether wafers are present in a chamber or if said chamber is empty and depending upon whether said chamber is at atmospheric pressure or if said chamber is pumped down to a vacuum;
   first indicator logic circuitry, connected to said cassette logic circuitry, for receiving said first signal, for continuously driving a first indicator when said chamber is ready to be loaded with wafers, and for intermittently driving said first indicator when said first signal indicates that said chamber has wafers that are ready to be unloaded;
   second indicator logic circuitry for intermittently driving a second indicator when an alarm signal is received and for continuously driving said second indicator when said production process is placed in an interrupt mode;
   third indicator logic circuitry for continuously driving a third indicator when wafers in said chamber are being processed; and
   means for generating an oscillating signal that is used by said first indicator logic circuitry for intermittently driving said first indicator and by second indicator logic circuitry for intermittently driving said second indicator;
   wherein said second indicator logic circuitry is connected to said first indicator logic circuitry and to said third indicator logic circuitry and prevents said first indicator logic circuitry and said third indicator logic circuitry from respectively driving said first and third indicators whenever said alarm signal is received at said second indicator logic circuitry.

11. An apparatus for indicating the states of a semiconductor wafer production process, comprising:
   cassette logic circuitry for generating a first signal that varies depending upon whether wafers are present in a chamber or if said chamber is empty and depending whether said chamber is at atmospheric pressure or if said chamber is pumped down to a vacuum;
   first indicator logic circuitry, connected to said cassette logic circuitry, for receiving said first signal, for continuously driving a first indicator when said chamber is ready to be loaded with wafers, and for intermittently driving said first indicator when said first signal indicates that said chamber has wafers that are ready to be unloaded;
   second indicator logic circuitry for intermittently driving a second indicator when an alarm signal is received and for continuously driving said second indicator when said production process is placed in an interrupt mode;
   third indicator logic circuitry for continuously driving a third indicator when wafers in said chamber are being processed; and
   means for generating an oscillating signal that is used by said first indicator logic circuitry for intermittently driving said first indicator and by said second logic indicator circuitry for intermittently driving said second indicator, said oscillating signal generating means comprising:
   a first inverter, a second inverter, and a third inverter connected in series with each other;
   a first resistor and a second resistor connected in series with each other and between said first inverter and said third inverter;
   a capacitor having a first terminal connected between said second inverter and said third inverter and a second terminal connected between said first resistor and said second resistor;
   a first LED connected across said second inverter; and
   a second LED connected across said second inverter and being reverse biased with respect to said first LED;
   wherein said oscillating signal is generated at an output of said third inverter and said first LED and said second LED enable said oscillating signal to have a lower frequency than that possible without said first LED and said second LED;
   wherein said second indicator logic circuitry is connected to said first indicator logic circuitry and to said third indicator logic circuitry and prevents said first indicator logic circuitry and said third indicator logic circuitry from respectively driving said first and third indicators whenever said alarm signal is received at said second indicator logic circuitry.

12. An apparatus for generating an oscillating signal, comprising:
   a first inverter, a second inverter, and a third inverter connected in series with each other;
   a first resistor and a second resistor connected in series with each other and between said first inverter and said third inverter;
   a capacitor having a first terminal connected between said second inverter and said third inverter and a second terminal connected between said first resistor and said second resistor;
   a first LED connected across said second inverter; and
   a second LED connected across said second inverter and being reverse biased with respect to said first LED;
   wherein said oscillating signal is generated at an output of said third inverter and said first LED and said second LED enable said oscillating signal to have a lower frequency than that possible without said first LED and said second LED.

* * * * *